United States Patent
Higashiyama (10) Patent No.: US 7,017,791 B2
(45) Date of Patent: Mar. 28, 2006

(54) ULTRASONIC BONDING METHOD AND DEVICE

(75) Inventor: Yuzo Higashiyama, Omihachiman (JP)

(73) Assignee: Murata Manufacturing Co., Ltd., (JP)

(*) Notice: Subject to any disclaimer, the term of this patent is extended or adjusted under 35 U.S.C. 154(b) by 0 days.

(21) Appl. No.: 10/646,911

(22) Filed: Aug. 22, 2003

(65) Prior Publication Data
US 2004/0041003 A1 Mar. 4, 2004

(30) Foreign Application Priority Data

Aug. 29, 2002 (JP) ............................. 2002-250111
Jul. 17, 2003 (JP) ............................. 2003-198279

(51) Int. Cl.
*B23K 37/00* (2006.01)
*B23K 5/20* (2006.01)
*B32B 31/00* (2006.01)

(52) U.S. Cl. ................. 228/1.1; 228/110.1; 156/580.1; 156/580.2

(58) Field of Classification Search ................ 228/1.1, 228/110.1; 156/73.1, 73.6, 580.1, 580.2, 156/73.5
See application file for complete search history.

(56) References Cited

U.S. PATENT DOCUMENTS

| | | | | |
|---|---|---|---|---|
| 4,821,945 A | * | 4/1989 | Chase et al. ............. | 228/180.5 |
| 5,460,320 A | * | 10/1995 | Belcher et al. ......... | 228/180.2 |
| 5,651,494 A | * | 7/1997 | Ogino et al. ............. | 228/110.1 |
| 5,826,407 A | * | 10/1998 | Giacomelli et al. ........... | 53/477 |
| 6,273,980 B1 | * | 8/2001 | Akiyama et al. .......... | 156/73.5 |
| 6,357,506 B1 | * | 3/2002 | Nomura et al. ............. | 156/580 |
| 6,517,652 B1 | * | 2/2003 | Gratz ........................ | 156/73.5 |
| 2003/0160084 A1 | * | 8/2003 | Higashiyama .............. | 228/1.1 |

FOREIGN PATENT DOCUMENTS

| | | |
|---|---|---|
| EP | 1 011 127 A2 | 6/2000 |
| EP | 1 074 330 A | 2/2001 |
| JP | 59-208844 | 11/1984 |
| JP | 1-244630 | 9/1989 |
| JP | 2001-44242 | 2/2001 |
| JP | 2001-110850 | 4/2001 |
| JP | 2001-127114 | 5/2001 |

OTHER PUBLICATIONS

Korean Office Action issued Aug. 26, 2005.
European Search Report issued Jul. 1, 2005.

* cited by examiner

*Primary Examiner*—Lynne R. Edmondson
(74) *Attorney, Agent, or Firm*—Ostrolenk, Faber, Gerb & Soffen, LLP

(57) ABSTRACT

In an ultrasonic bonding method that bonds a material to a bonding surface by the application of ultrasonic vibration, both side faces of the material in the direction of ultrasonic vibration are clamped by an application member that applies a predetermined ultrasonic vibration, and by a clamping member. The clamping member is synchronously vibrated by ultrasonic vibration transmitted through the material from the application member, and the material is bonded to the bonding surface while being pressed against the application member and against the bonding surface. In this method, high bonding quality can be achieved by efficiently transmitting ultrasonic vibration from the application member to a material to be bonded, and the material can be prevented from tilting, cracking, chipping, or the like without being subjected to a special working operation, for example, forming of a chamfered portion.

13 Claims, 9 Drawing Sheets

ULTRASONIC BONDING METHOD AND DEVICE

BACKGROUND OF THE INVENTION

1. Field of the Invention

The present invention relates to an ultrasonic bonding method and device that bonds a material to a bonding surface by the application of ultrasonic vibration.

2. Description of the Related Art

Ultrasonic bonding devices are widely used to subject electronic components, such as semiconductor devices and piezoelectric elements, to flip-chip bonding onto substrates or the like.

Figure 8:
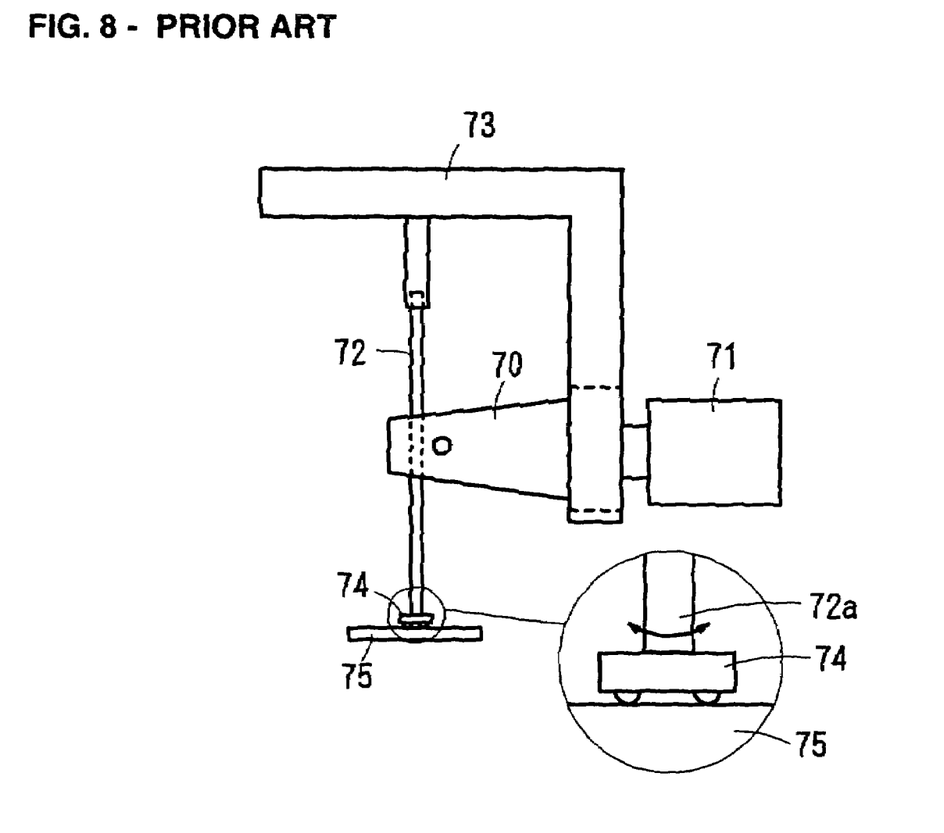
FIG. 8 is a front view of an example of a known ultrasonic bonding device.

Japanese Unexamined Patent Application Publication No. 2001-44242 discloses an ultrasonic bonding device that bonds a material onto a bonding surface while applying pressing load and ultrasonic vibration to the material. In the ultrasonic bonding device, as shown in FIG. 8, a vibrator 71 is attached to one end of a tapered horn 70 to apply longitudinal vibration in the lengthwise direction of the horn 70. A bonding tool 72 is attached to the horn 70 at an antinode of a standing wave of the longitudinal vibration of the horn 70, and extends in a direction substantially orthogonal to the direction of the longitudinal vibration. A connecting portion 73 is provided at almost the center of the horn 70 to be connected to a pressing means for applying a pressing load. When the horn 70 vibrates, a substantially horizontal vibration is transmitted to a contact portion 72a at the leading end of the bonding tool 72 in contact with a material 74 to be bonded. In this case, the vibration is transmitted to the material 74 by a frictional force produced when the material 74 is pressed by the contact portion 72a of the bonding tool 72.

In the configuration shown in FIG. 8, the transmission of vibration to the material 74 is influenced by the frictional force between the contact portion 72a of the bonding tool 72 and the material 74. For this reason, when the frictional force between the material 74 and a bonding surface 75 is greater than the frictional force between the contact portion 72a of the bonding tool 72 and the material 74, the contact between the contact portion 72a and the material 74 can slip, so that vibration is not sufficiently transmitted to the material 74. As a result, bonding failure occurs. Moreover, since the amplitude of the ultrasonic vibration is low (limited to approximately 0.6 μm), and bonding energy is small, it is difficult to perform bonding in a short time and at ordinary temperatures.

Figure 9:
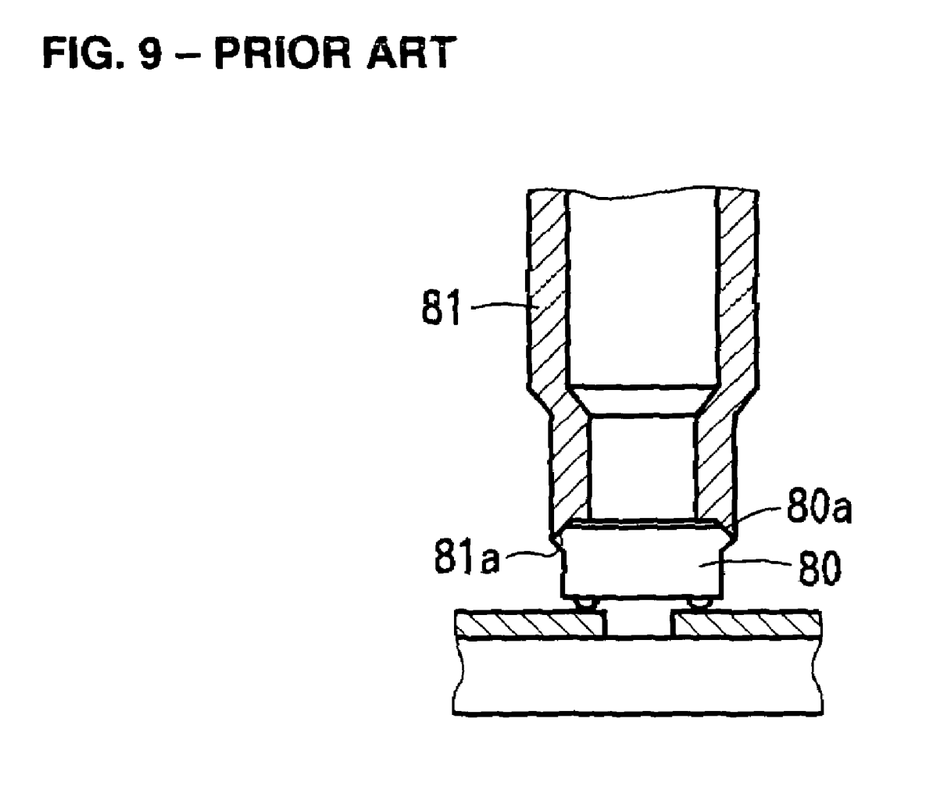
FIG. 9 is a partial sectional view of another example of a known ultrasonic bonding device.

On the other hand, Japanese Unexamined Patent Application Publication No. 2001-110850 discloses an ultrasonic bonding device that prevents a material to be bonded from being displaced from a suction tool in the direction of ultrasonic vibration. That is, as shown in FIG. 9, a chamfered portion 80a is formed beforehand on an upper surface of a material 80 to be bonded, and is brought into contact with chamfered portions 81a provided on two sides of a bonding tool 81 in the direction of ultrasonic vibration, thereby preventing the displacement of the material 80.

In this case, since the chamfered portion 80a of the material 80 and the chamfered portions 81a of the bonding tool 81 are in contact with each other, there is no influence of the frictional force, which is different from the device shown in FIG. 8. However, the cost is increased because it is necessary to form the chamfered portion 80a on the material 80 to be bonded. Moreover, the chamfered portions 80a and 81a are not always in precise contact with each other when drawing the material 80, and the material 80 may tilt. Furthermore, since a great force is applied to the chamfered portion 80a of the material 80, the material 80 may be cracked or chipped.

SUMMARY OF THE INVENTION

Accordingly, the present invention provides an ultrasonic bonding method and device in which a high bonding quality can be achieved by efficiently transmitting ultrasonic vibration from an application member to a material to be bonded, and the material can be prevented from tilting, cracking, chipping, or the like without being subjected to a special working operation, for example, forming of a chamfered portion.

According to one aspect of the invention, the present invention provides an ultrasonic bonding method for bonding a material to a bonding surface by the application of ultrasonic vibration. The two side faces of the material in the direction of ultrasonic vibration are clamped respectively by an application member that applies a predetermined ultrasonic vibration, and by a clamping member. The clamping member is synchronously vibrated in the same direction as that of the application member and at an amplitude substantially equal to that of the application member by the predetermined ultrasonic vibration transmitted from the application member through the material. The material is bonded to the bonding surface while being pressed against the application member by the clamping member.

Since both side faces in the direction of ultrasonic vibration of the material to be bonded are clamped by the application member that applies ultrasonic vibration and by the clamping member, the application member, the material, and the clamping member vibrate synchronously, and the vibration of the application member is efficiently transmitted to the material. Consequently, the vibration can be stably transmitted to the material without subjecting the material to a new working operation, such as chamfering, and a high bonding quality can be achieved at low cost.

Since vibration can be transmitted to a material to be bonded without any influence of frictional force in the present invention, the material can be vibrated at a high amplitude (e.g., 1 μm or more) and with few variations. This makes it possible to produce a great bonding energy in a bonding portion and to achieve bonding in a short time and at ordinary temperatures.

Since both side faces in the direction of ultrasonic vibration of the material to be bonded are clamped by the application member and the clamping member, a great force does not act on any part of the material, and the material can be prevented from cracking or chipping, compared with the conventional case using chamfering.

The clamping member is designed to be synchronously vibrated in the same direction as that of the application member and at an amplitude substantially equal to that of the application member by ultrasonic vibration transmitted from the application member through the material. While the resonant frequency of the clamping member could be set to be equal to the frequency of ultrasonic vibration, the amplitude of the clamping member in such a case would be higher than that of the application member, depending on the structure of the clamping member, so the material could be moved excessively and repeatedly relative to the application member and the clamping member. Consequently, a relatively large clearance would be required between the material, the application member and the clamping member, and this could decrease the efficiency of transmission of vibration to the material.

Accordingly, the resonant frequency of the clamping member is preferably slightly shifted from the frequency of ultrasonic vibration in order to limit the amplitude of the clamping member to as close to the amplitude of the application member as possible. Since the clearance between the material, and the application member and the clamping member is thereby reduced, a high efficiency of transmission of vibration to the material can be ensured.

Preferably, the difference in amplitude between the application member and the clamping member is 10% or less.

Instead of shifting the resonant frequency from the frequency of ultrasonic vibration, as described above, the amplitude of the clamping member may be adjusted, for example, by shifting an operating point of the clamping member (the point that clamps the material to be bonded) from the point where the maximum amplitude is achieved, or by changing the material (particularly, the attenuation coefficient), the size, or the like of the clamping member.

A predetermined pressing load may be applied to the application member in a direction so as to press the material against the bonding surface, during the application of the ultrasonic vibration.

By controlling the pressing load between the material and the bonding surface, a stable bonding quality can be obtained.

The opposing distance between the material and the bonding surface may be controlled, during the application of the ultrasonic vibration.

In this case, the gap between the material and the bonding surface can be controlled by exerting position control on the distance therebetween. In a case in which the material to be bonded is a high-frequency chip with bumps, the accuracy of the gap between the chip and a substrate after bonding is important, because the gap has an influence on the characteristics. It is also important to control the gap in order to control the degree to which the gap is filled with resin such as underfill. In the known bonding method using frictional force, a predetermined pressing force is necessary to produce a frictional force, and therefore, control of the gap is difficult. In the present invention, the amount of crushing of the bumps can be fixed, and the gap between the chip and the substrate can be fixed by controlling the opposing distance therebetween.

According to another aspect of the invention, the present invention provides an ultrasonic bonding device for bonding a material to a bonding surface by the application of ultrasonic vibration. The device includes a vibrator for producing ultrasonic vibration, an application member that supports one side face of the material in the direction of the ultrasonic vibration and that applies the ultrasonic vibration produced by the vibrator to the material, a clamping member that supports the other side face of the material in the direction of the ultrasonic vibration and that is synchronously vibrated in the same direction as that of the application member and at an amplitude substantially equal to that of the application member by the ultrasonic vibration transmitted from the application member through the material, and an urging member connected to a node of the clamping member to urge the clamping member in a clamping direction so as to clamp the material in cooperation with the application member. The application member, the clamping member, and the material can vibrate together in the direction of the ultrasonic vibration.

A material to be bonded is clamped by the application member and the clamping member, and the clamping member is synchronously vibrated by the ultrasonic vibration transmitted from the application member through the material. Therefore, vibration of the application member is efficiently transmitted to the material. Since the urging member for urging the clamping member in a direction so as to clamp the material in cooperation with the application member is connected to the node of the clamping member, vibration is not transmitted to the urging member. Consequently, the vibration of the vibrator is efficiently transmitted to the application member, the material to be bonded, and the clamping member.

In order to prevent the ultrasonic vibration from leaking outside, it is preferable that the clamping member be supported by a member separate from the application member. As the clamping member, a member that exhibits bending vibration, a member that exhibits longitudinal vibration, or the like may be arbitrarily selected.

The urging member may be an actuator, such as a cylinder or a solenoid, or may be a simple spring. When an actuator is used, since a material to be bonded can be easily clamped and released, operations concerning bonding will not be delayed. When a spring is used, it is preferable to provide a suitable mechanism that removes the urging force of the spring when a material to be bonded is taken out from between the application member and the clamping member.

Preferably, the application member has a first face for supporting one side face of the material in the direction of the ultrasonic vibration, and a second face substantially parallel to the bonding surface to support an upper surface of the material, and the second face has a suction hole for drawing the material.

By providing the application member with the first face for supporting the side face of the material and the second face for supporting the upper surface, a pressing load can be easily applied from the application member to the material, and the amount of pressing of the material can be controlled easily. Moreover, since the second face for supporting the upper surface is substantially parallel to the bonding surface, the material can be prevented from tilting when being held, and can be bonded substantially parallel to the bonding surface.

Preferably, the ultrasonic bonding device further includes a load control device for applying a downward pressing load to the application member, and for controlling the pressing load. This achieves a stable bonding quality.

Preferably, the ultrasonic bonding device further includes a position control twice for controlling the amount of downward movement of the application member. This allows the gap between the material and the bonding surface to be controlled easily.

Preferably, the application member is an ultrasonic horn shaped like a substantially symmetric inverted triangle. The vibrator is mounted at at least one of the right and left vertexes of the ultrasonic horn, and an output section is provided at a bottom vertex of the ultrasonic horn to apply ultrasonic vibration to the material. When an ultrasonic vibration substantially parallel to an oblique side adjoining either of the right and left vertexes of the ultrasonic horn is input from the vibrator, a horizontal ultrasonic vibration is output from the output section.

In this way, a horizontal ultrasonic vibration is obtained at the bottom vertex serving as the output section, and the ultrasonic horn is not bent. Consequently, the horizontal ultrasonic vibration can be applied to the material to be bonded, and bonding of high quality can be achieved.

In the case of the above horn shaped like an inverted triangle, a minimum-amplitude region (node region) exists adjacent to the center of an upper side of the horn opposing the bottom vertex. When the bottom vertex of the ultrasonic horn is used as a bonding portion, and a downward pressing load is applied to the node region serving as the load input section, vibration of the ultrasonic horn is not inhibited, and ultrasonic vibration is not transmitted to the loading device. Since the connecting portion between the loading device and the ultrasonic horn is positioned on the axial line of a pressing vector or adjacent thereto, bending stress is not produced in the ultrasonic horn, and the pressing load can directly act on an object to be bonded.

Further objects, features, and advantages of the present invention will become apparent from the following description of several embodiments with reference to the attached drawings.

DESCRIPTION OF EMBODIMENTS OF THE INVENTION

Figure 1:
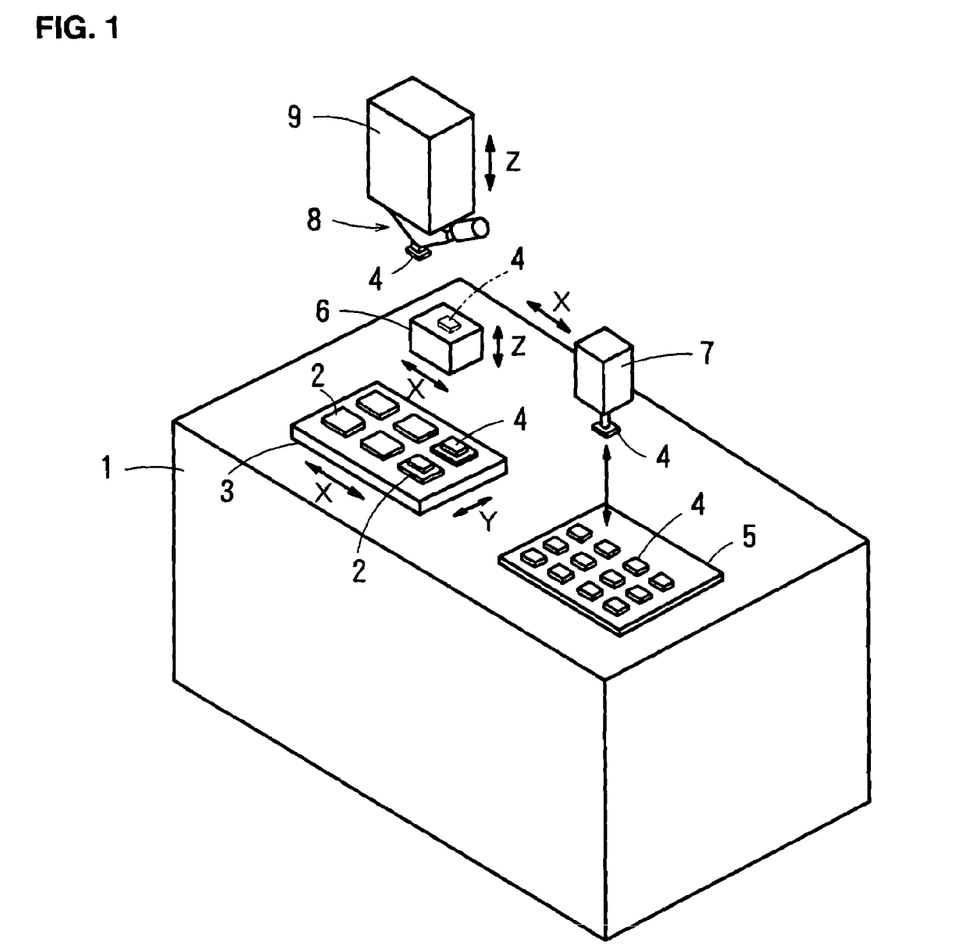
FIG. 1 is a general perspective view of a bonding apparatus equipped with an ultrasonic bonding device according to the present invention.

FIG. 1 shows the overall configuration of a bonding apparatus equipped with an ultrasonic bonding device according to a first embodiment of the present invention, in particular, of an apparatus that mounts a chip with bumps on a substrate by face-down mounting. An upper surface of an apparatus frame 1 of the bonding apparatus is provided with a mount stage 3 on which substrates 2 serving as bonding surfaces are mounted and supported, and a chip supply section 5 in which chips 4 with bumps serving as materials to be bonded are stored in an aligned state. Provided above the apparatus frame 1 are a chip-conveying stage 6, a chip supply unit 7 that supplies a chip 4 taken out of the chip supply section 5 to the chip-conveying stage 6, an ultrasonic bonding device 8 that receives the chip 4 supplied to the chip-conveying stage 6 and bonds the chip 4 onto a substrate 2 disposed on the mount stage 3, and an elevator block 9 that supports and vertically moves the ultrasonic bonding device 8.

The mount stage 3 is horizontally movable in the X-direction and the Y-direction for alignment with a chip 4 held by the ultrasonic bonding device 8, and heats a substrate 2 supported thereon by a built-in heater. The chip-conveying stage 6 is movable in the Z-direction and the X-direction to convey a chip 4 supplied by the chip supply unit 7 into a vertical path of the ultrasonic bonding device 8 and to deliver the chip 4 to the ultrasonic bonding device 8.

Figure 2:
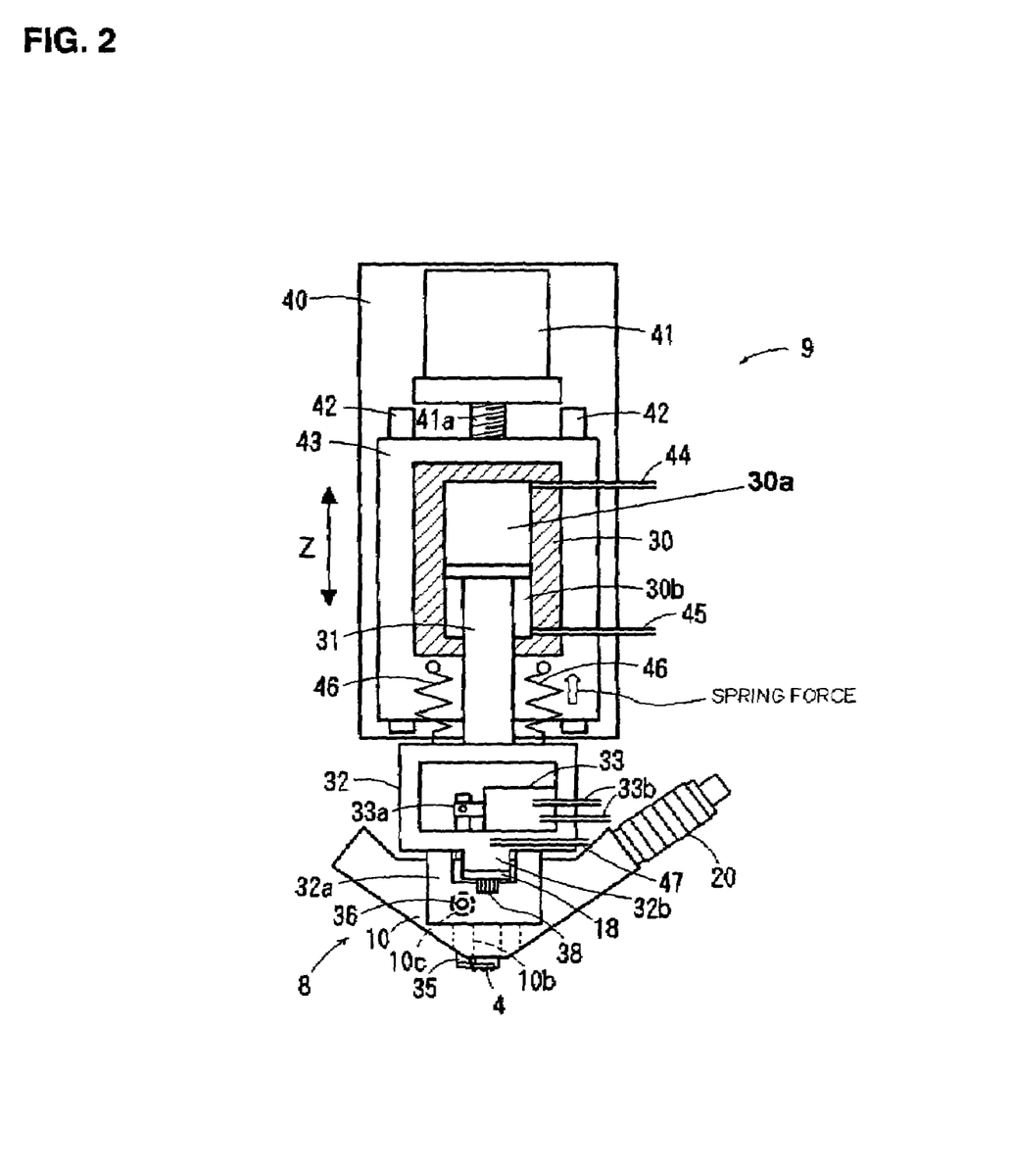
FIG. 2 is a front view of an elevator block shown in FIG. 1 according to a first embodiment of the invention.
Figure 3:
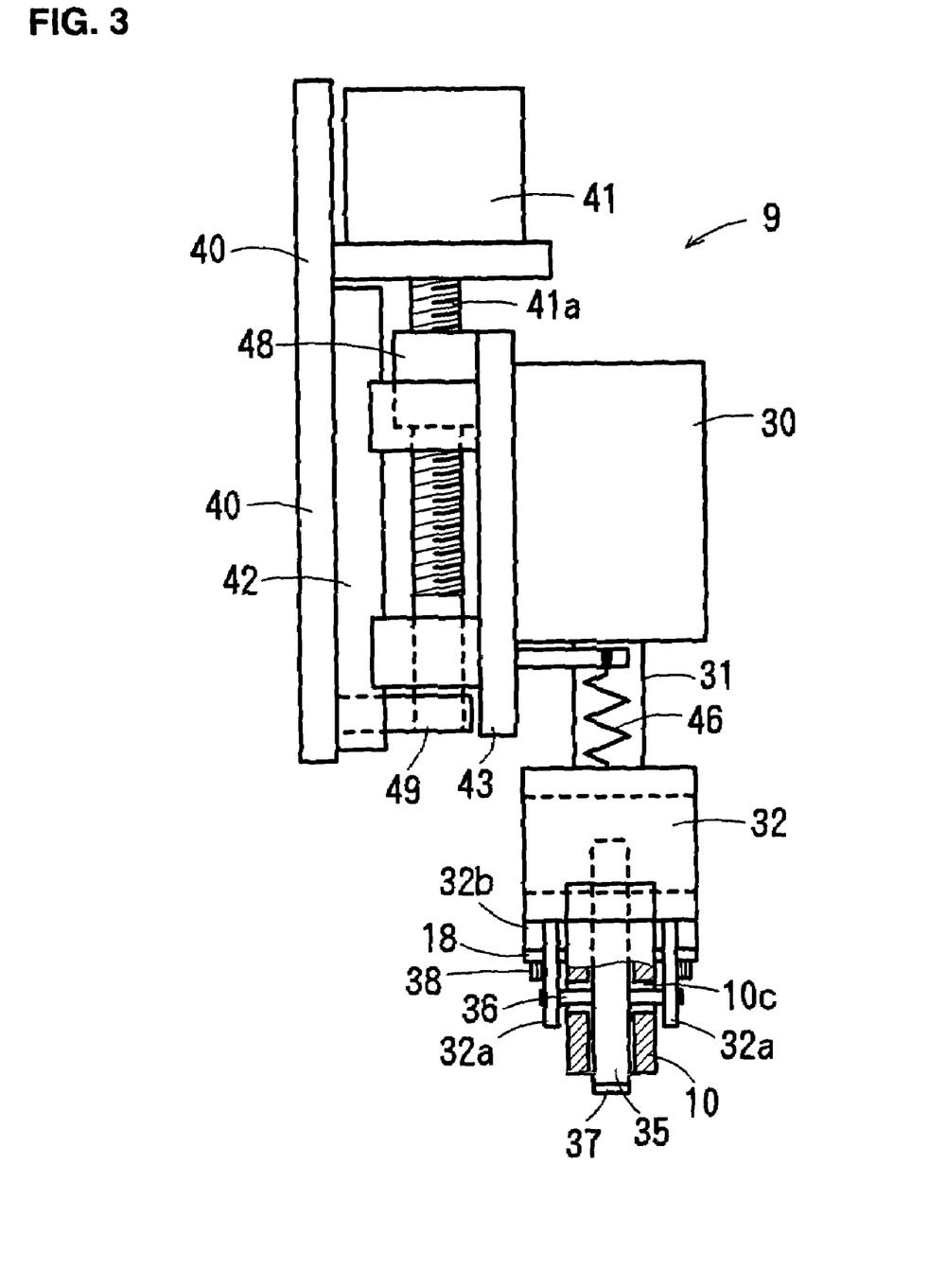
FIG. 3 is a left side view of the elevator block shown in FIG. 2.
Figure 4:
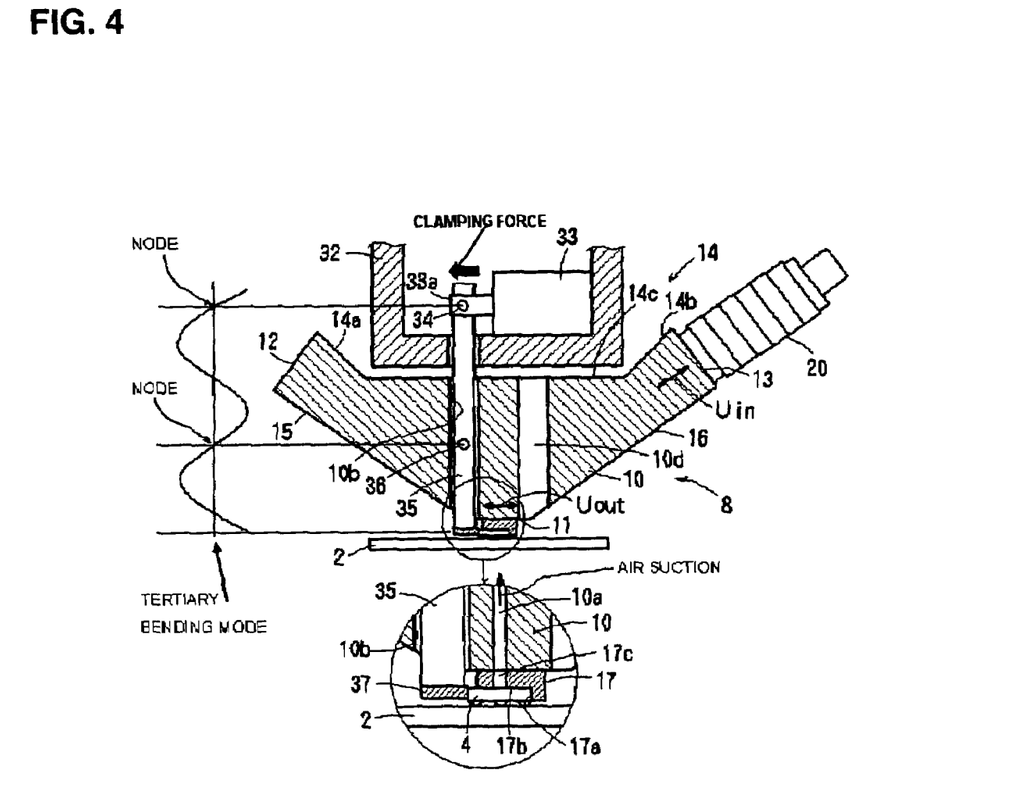
FIG. 4 is an enlarged sectional view of an ultrasonic bonding device of the first embodiment shown in FIG. 2.

FIGS. 2 and 3 show a specific configuration of the elevator block 9, and FIG. 4 shows a detailed configuration of the ultrasonic bonding device 8.

The elevator block 9 includes a base 40, an elevating device 41, such as a servo motor, fixed to the base 40, a slide plate 43 attached to the base 40 by guide portions 42 to be vertically movable, a loading device 30, such as an air cylinder, fixed to the slide plate 43, and so on. A rotation shaft of the elevating device 41 is formed of a threaded shaft 41a, and the threaded shaft 41a is screwed in a nut portion 48 provided on the slide plate 43. The leading end of the threaded shaft 41 a is rotatably supported by a bearing 49. By driving the elevating device 41, the slide plate 43 can vertically move to let a chip 4 held by an ultrasonic horn 10, which will be described later, down to a substrate 2. The loading device 30 has a piston rod 31, and a pressing jig 32 is fixed to the bottom end of the piston rod 31. The pressing jig 32 is connected to a connecting portion 18 of the ultrasonic horn 10, as will be described later. By supplying pressurized air into one chamber 30a of the loading device 30 through a pipe 44, a downward pressing load can be given to the ultrasonic horn 10 through the piston rod 31. On the other hand, air existing in the other chamber 30b can be exhausted through a pipe 45. Weight-canceling springs 46 are laid between the slide plate 43 and the pressing jig 32. The springs 46 cancel not only the weight of the ultrasonic horn 10, but also the weights of all the other constituents hung from the springs 46, for example, the pressing jig 32 and an actuator 33 therein. For this reason, the pressing load applied by the ultrasonic horn 10 to objects to be bonded (a chip 4 and a substrate 2) is not influenced by the weights of the constituents, but can be set by only the air pressure supplied into the chamber 30a of the loading device 30.

The weights may alternatively be cancelled by supplying pressurized air into the other chamber 30b through the pipe 45, instead of using the springs 46.

While an air cylinder is used as the loading device 30 in the above embodiment, other means, such as a voice coil motor, or a combination of a motor and a ball screw mechanism, may be used.

The pressing jig 32 is shaped like a box, and a direct-acting actuator 33, such as an air cylinder, is fixed therein. An operation shaft 33a of the actuator 33 moves in the horizontal direction in FIG. 2, and a node at the upper end of a clamping member 35 is rotatably supported by the operation shaft 33a through a rotatable pin 34. Air pipes 33b are used to operate the actuator 33. A pair of bearing portions 32a vertically stand integrally with the lower surface of the pressing jig 32, and both ends of a turning shaft 36 fixed to a middle node of the clamping member 35 are bored between the bearing portions 32a. For this reason, when the operation shaft 33a of the actuator 33 is moved forward, the clamping member 35 turns on the turning shaft 36, and can clamp a chip 4 in cooperation with the horn 10 of the ultrasonic bonding device 8, as will be described later. The clamping member 35 of this embodiment is shaped like a rod, and the material and shape thereof are designed to exhibit a tertiary bending mode vibration near a frequency (e.g., 60 kHz) of ultrasonic vibration produced by the ultrasonic horn 10, and vertically extends through a vertical hole 10b of the ultrasonic horn 10 without contact therewith. The turning shaft 36 extends in the forward-rearward direction through a horizontal hole 10c of the ultrasonic horn 10 without contact therewith. Therefore, the clamping member 35 and the turning shaft 36 are not in contact with the ultrasonic horn 10. The ultrasonic horn 10 also has a vertical hole 10d formed at a position symmetrical with respect to the vertical hole 10b to acquire balance.

Since the node at the upper end of the clamping member 35 is connected to the operation shaft 33a and the turning shaft 36 is fixed to the middle node, as described above, when the clamping member 35 vibrates in a tertiary bending mode, as showns in FIG. 43 the vibration is hardly transmitted to the operation shaft 33a and the turning shaft 36, and can be prevented from leaking. A contact member 37 made of resin or the like is detachably fixed to the lower end of the clamping member 35, that is, to an antinode of vibration, and presses one side face of the chip 4 in the direction of ultrasonic vibration.

In the first embodiment, the clamping member 35 is made of cemented carbide (having a Young's modulus of 580 GPa and a density of $13.9 \times 10^3$ kg/m$^3$), and the resonant frequency of tertiary bonding mode vibration thereof is set at approximately 61 kHz. That is, the resonant frequency of the clamping member 35 is intentionally shifted by 1 kHz from the frequency (60 kHz) of ultrasonic vibration. Consequently, the amplitude of the clamping member 35 at the frequency of ultrasonic vibration is lower than the amplitude (maximum amplitude) at the resonant frequency, so that the amplitude of the contact member 37 attached to the bottom end of the clamping member 35 can be made substantially equal to the amplitude of a contact member 17 attached to a bottom vertex 11 of the ultrasonic horn 10, as will be described later. As a result, the chip 4 can be stably clamped between the contact members 17 and 37, and ultrasonic vibration can be effectively applied thereto. The amplitude difference between the contact members 17 and 37 may be 10% or less, and in this embodiment, is set at approximately 5% by shifting the frequency by 1 kHz. The amount of shift of the frequency differs according to the material, size, and the like of the clamping member 35.

The ultrasonic bonding device 8 bonds a chip 4 with bumps to a substrate 2 by the application of pressing load and ultrasonic vibration, as described above, and has an ultrasonic horn 10 shaped like an inverted isosceles triangle. A main body of the ultrasonic horn 10 is integrally made of a metal material, for example, an aluminum alloy, cemented carbide, a titanium alloy, or stainless steel. The ultrasonic horn 10 has a cut surface at each of the bottom, left, and right vertexes 11, 12, and 13. The cut surface at the bottom vertex 11 is parallel to an upper side 14, and the left and right vertexes 12 and 13 are substantially perpendicular, respectively, to oblique sides 15 and 16. In the first embodiment, the angle θ of the bottom vertex 11 is set within the range of 60° to 150°, more preferably, within the range of 90° to 120°.

The upper side 14 of the ultrasonic horn 10 is concave, having two inclined faces 14a and 14b and one bottom face 14c in the first embodiment. However, it may be flat or convex.

A contact member 17 made of a wear-resistant material (e.g., cemented carbide, ceramic, or diamond) is detachably fixed to the cut surface at the bottom vertex 11 of the ultrasonic horn 10. The contact member 17 has an L-shaped cross section, and includes a face 17a for supporting one side face of the chip 4 in the direction of ultrasonic vibration, and a face 17b for supporting an upper surface of the chip 4, as shown in FIG. 4. The other side face of the chip 4 in the direction of ultrasonic vibration is supported by the contact member 37 of the clamping member 35.

The contact member 17 has a drawing hole 17c used to draw the chip 4. The drawing hole 17a communicates with a suction hole 10a provided in the ultrasonic horn 10, and an upper end of the suction hole 10a is connected to a vacuum attraction apparatus (not shown) through a vacuum pipe 47 shown in FIG. 2. The vacuum pipe 47 is preferably formed of a hose made of a flexible and elastic material.

A piezoelectric vibrator 20 is fixed to the cut surface at one of the left and right vertexes 12 and 13 of the ultrasonic horn 10 (herein, at the right vertex 13), and applies ultrasonic vibration Uin parallel to the oblique side 16 to the right vertex 13. The direction of vibration may be offset by an angle of approximately ±10° from the oblique side 16. While it is preferable that the frequency of the vibration be within the range, for example, of 20 kHz to 200 kHz, a frequency of approximately 60 kHz is used here. Since the ultrasonic horn 10 is symmetric, similar operational advantages can be provided when the vibrator 20 is provided at either of the left and right vertexes 12 and 13. Flange-shaped connecting portions 18 protrude from the front and back surfaces adjacent to the center of the upper side 14 opposing the bottom vertex 11 and slightly below the upper side 14. The connecting portions 18 are provided at a node of vibration of the ultrasonic horn 10, and the protruding length of the connecting portions 18 is designed not to produce resonance at the frequency of ultrasonic vibration. The piston rod 31 of the above-described loading device 30 is connected to the connecting portions 18 with the pressing jig 32 therebetween. Two legs 32b protrude downward from the pressing jig 32, and are fixed to the connecting portions 18 by fasteners 38 such as bolts. For this reason, the pressing jig 32 does not contact the portions of the ultrasonic horn 10 other than the connecting portions 18.

For example, when ultrasonic vibration Uin substantially parallel to the oblique side 16 is input to the right vertex 13 of the ultrasonic horn 10 having the above-described shape, horizontal vibration Uout (parallel to the bonding surface 2) is produced at the bottom vertex 11. Moreover, the amplitude at the bottom vertex 11 is higher than at the right vertex 13. That is, the amplitude of the ultrasonic vibration Uin input from the right vertex 13 is amplified, and is output as a strong ultrasonic vibration Uout from the bottom vertex 11.

Furthermore, the connecting portions 18 provided in the node region of the ultrasonic horn 10 serve as load input sections, and the loading device 30 (pressing jig 32) is connected to the input sections 18. Therefore, ultrasonic vibration does not propagate from the connecting portions 18 to the loading device 30, and disturbance vibration is not produced. When a downward pressing load is applied by the loading device 30, it can directly act on the bottom vertex 11 without bending the ultrasonic horn 10, because a vector of the pressing load passes through the bottom vertex 11. Accordingly, the ultrasonic vibration and the pressing load can uniformly act on the entire bonding surface 2, and uniform and proper bonding can be achieved.

As described above, the two side faces of the chip 4 in the direction of ultrasonic vibration are clamped respectively by the contact member 17 provided in the ultrasonic horn 10 and the contact member 37 provided in the clamping member 35. Since the contact member 37 is provided in the clamping member 35 that synchronously vibrates at the ultrasonic vibration frequency, both the contact members 17 and 37 synchronously vibrate, and the vibration of the ultrasonic horn 10 is efficiently transmitted to the chip 4. In particular, since the chip 4 is supported at the antinode (contact member 37) of vibration of the clamping member 35 in the first embodiment, vibration of the ultrasonic horn 10 is transmitted to the chip 4 with little loss.

In the present invention, the chip 4 is vibrated with both side faces in the direction of ultrasonic vibration clamped by the horn 10 and the clamping member 35, and therefore, can be vibrated at a high amplitude (e.g., 1 μm or more). For this reason, a great bonding energy can be produced on the bonding surface 2, and bonding can be performed in a short time and at ordinary temperatures.

In addition, since both side faces in the direction of ultrasonic vibration of the material to be bonded are clamped by the loading member and the clamping member, a great force does not act on any part of the material, so that the material can be prevented from being cracked or chipped, compared with the conventional case using chamfering.

The operation of the bonding apparatus of FIGS. 2–4 having the above-described configuration will now be described.

When a chip 4 is bonded to a substrate 2 mounted and supported on the mount stage 3, the substrate 2 is heated beforehand by the heater incorporated in the mount stage 3. In order to hold the chip 4 between the contact members 17 and 37, the actuator 33 is driven in a direction such that the contact member 37 at the leading end of the clamping member 35 separates from the contact member 17, the contact member 17 is brought into contact with a side face of a chip 4 supplied on the chip-conveying stage 6, and the actuator 33 is then driven in a closing direction so that the chip 4 is clamped between the contact members 17 and 37. After the substrate 2 and the chip 4 are aligned, the ultrasonic bonding device 8 is moved down to bring the chip 4 into contact with the substrate 2, and a predetermined pressing load is applied by the loading device 30. When ultrasonic vibration Uin is applied from the piezoelectric vibrator 20 to the right vertex 13 of the ultrasonic horn 10, vibration Uout substantially parallel to the bonding surface 2 is produced in the contact member 17, and is transmitted to the chip 4. In this case, the vibration is also transmitted to the clamping member 35 through the chip 4, and the clamping member 35 vibrates synchronously. As a result, the contact member 17 of the horn 10, the chip 4, and the contact member 37 of the clamping member 35 vibrate synchronously, and the chip 4 is reliably bonded to the substrate 2.

Figure 5:
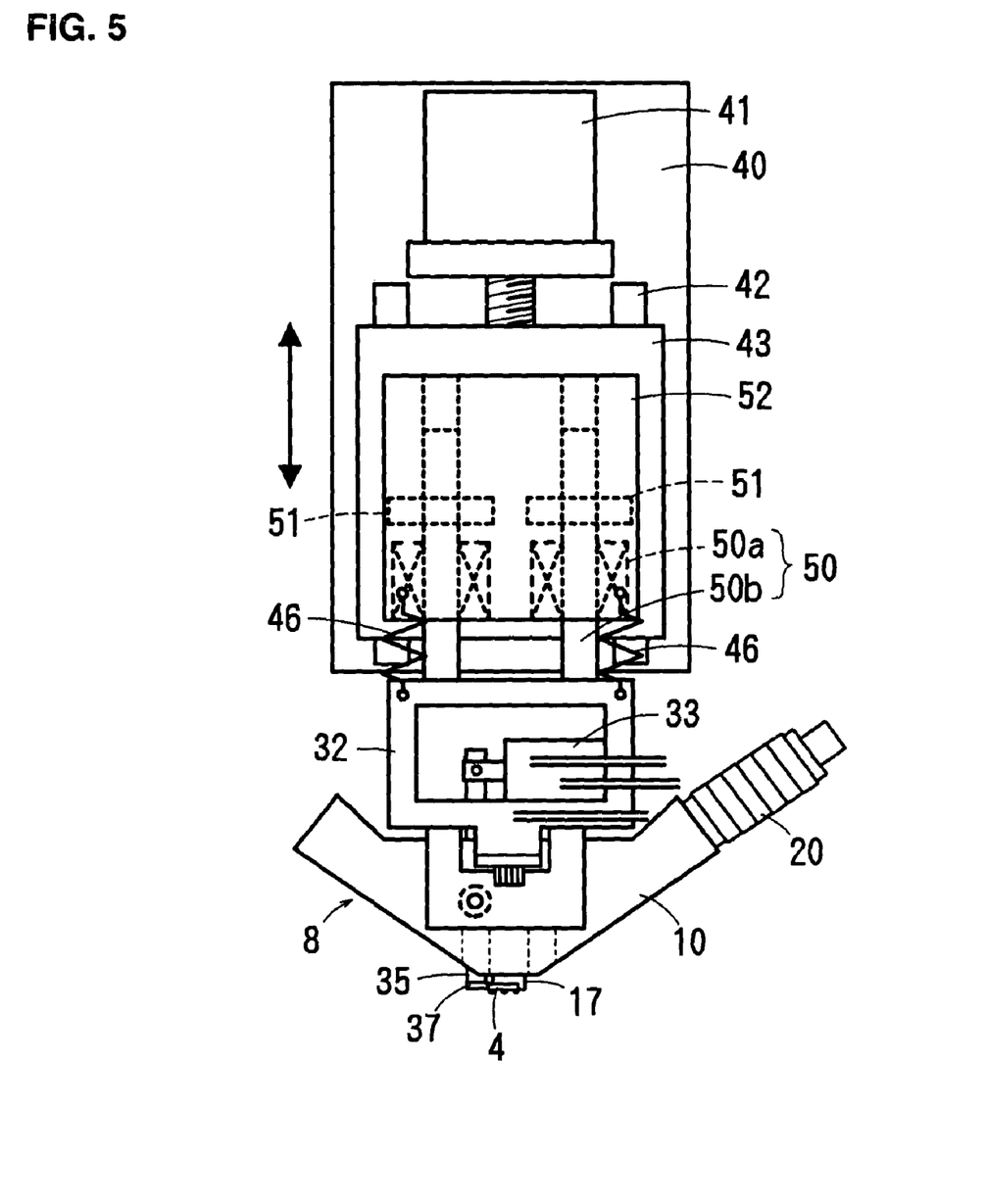
FIG. 5 is a front view of an elevator block according to a second embodiment.
Figure 6:
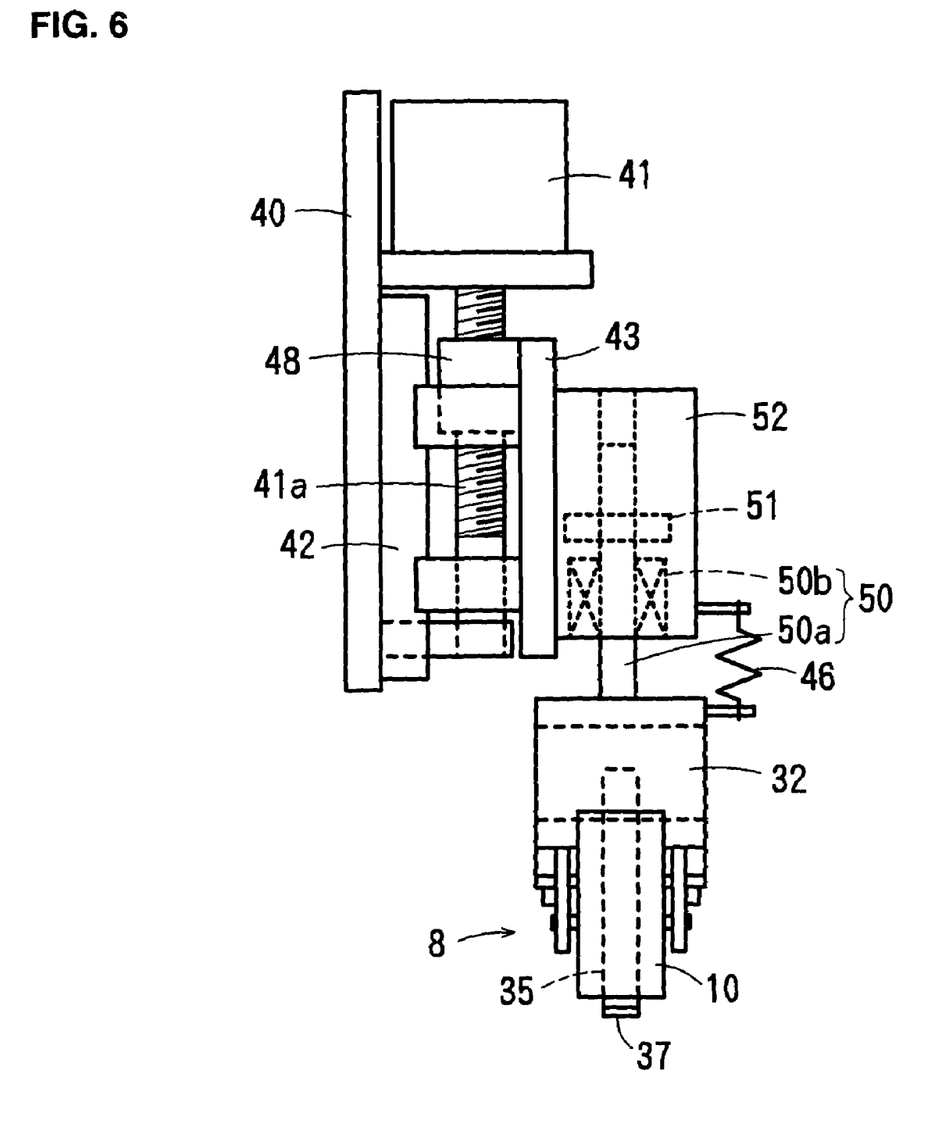
FIG. 6 is a left side view of the elevator block shown in FIG. 5.

FIGS. 5 and 6 show an elevator block having an ultrasonic bonding device according to a second embodiment of the present invention.

In the first embodiment, the chip 4 and the substrate 2 are bonded by ultrasonic vibration while the loading device 30 imposes a predetermined pressing load thereon. In the second embodiment, a chip 4 and a substrate 2 are bonded by position control, instead of load control, and the gap therebetween is controlled. The same components as those in FIGS. 2 and 3 are denoted by the same reference numerals, and redundant descriptions thereof are omitted.

Slide guides 50, each composed of a bush 50a and a shaft 50b, are provided above a jig 32. The shafts 50b are connected to an upper surface of the jig 32, and extend through the bushes 50a and guide brakes 51 provided inside a guide case 52. The guide brakes 51 exert control to place the shafts 50n at two positions, namely, a fastening position and a releasing position. Weight-canceling springs 46 are laid between the guide case 52 and the jig 32. The upper ends of the springs 46 may be connected to a slide plate 43.

The elevator block having the above structure operates as follows:

First, an ultrasonic bonding device 8 that is holding a chip 4 is moved down to bring the chip 4 into contact with a substrate 2 in a state in which the guide brakes 51 are released. In this case, since the ultrasonic bonding device 8 is hung by the weight-canceling springs 46, bumps provided on the chip 4 are hardly crushed. By doing this, the bumps are hardly crushed (the amount of crushing is fixed) even when the substrate 2 is uneven.

Next, the ultrasonic bonding device 8 is restrained not to vertically move relative to the slide plate 43 by operating (fastening) the guide brakes 51. When the slide plate 43 is moved down by driving an elevating device 41, the ultrasonic bonding device 8 is moved down together. Simultaneously, an ultrasonic vibration is applied to bond the chip 4 to the substrate 2. After the amount of downward movement reaches a predetermined amount, the movement is stopped to complete bonding.

Since both side faces of the chip 4 in the direction of ultrasonic vibration are clamped by contact members 17 and 37, there is no need to apply a load that produces a frictional force to transmit the vibration to the chip 4. For this reason, the chip 4 and the substrate 2 can be bonded without crushing the bumps to a higher degree than necessary. Furthermore, the gap between the chip 4 and the substrate 2 after bonding can be controlled to be a desired value by adjusting the amount of downward movement of the ultrasonic bonding device 8.

Figure 7:
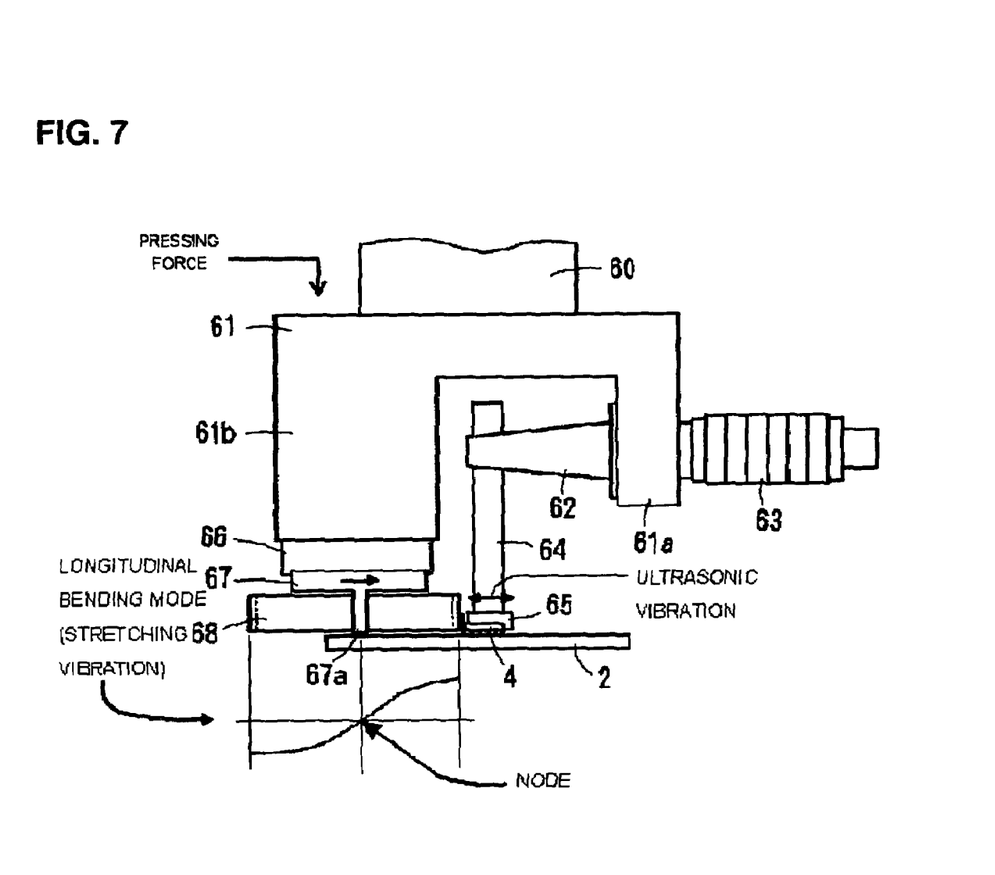
FIG. 7 is a front view of an ultrasonic bonding device according to a third embodiment of the present invention.

FIG. 7 shows an ultrasonic bonding device according to a third embodiment of the present invention.

In the third embodiment, a holder 61 is fixed to a lower end of a loading device 60 that applies a vertical load, and an ultrasonic horn 62 is mounted on one leg 61a of the holder 61. A vibrator 63 is attached to one end of the ultrasonic horn 62, and a rodlike application member 64 is connected to the other end, that is, to an antinode of vibration. The application member 64 receives ultrasonic vibration from the ultrasonic horn 62, and exhibits bending vibration so that a portion connected to the horn 62 and the lower end serve as antinodes of the vibration. A contact member 65 is attached to the lower end of the application member 64 to support one side face in the direction of ultrasonic vibration and an upper surface of a chip 4. The contact member 65 applies a downward pressing load and a horizontal ultrasonic vibration to the chip 4.

An actuator 66 is fixed to a lower end of the other leg 61b of the holder 61, and an operating member 67 that can be horizontally moved by the actuator 66 is provided on a lower surface of the actuator 66. The operating member 67 is connected through a connecting portion 67a to a node of a clamping member 68 that vibrates in a longitudinal vibration mode. The clamping member 68 has a resonant frequency substantially equal to the resonant frequency of the application member 64, and exhibits longitudinal vibration (stretching vibration) substantially parallel to a substrate 2 (bonding surface). The connecting portion 67a is positioned at a node of the clamping member 68, and the other side face of the chip 4 in the direction of ultrasonic vibration is supported at an antinode of the vibration. A contact member made of resin or the like (shown but not numbered in FIG. 7) may be mounted at a portion of the clamping member 68 in contact with the chip 4.

In the ultrasonic bonding device of the third embodiment, when ultrasonic vibration is applied from the vibrator 63 to the ultrasonic horn 62, it is transmitted to the application member 64 to produce bending vibration after being amplified by the ultrasonic horn 62. Since both side faces of the chip 4 in the direction of the ultrasonic vibration are clamped by the contact member 65 attached to the application member 64, and the clamping member 68, the application member 64, the chip 4, and the clamping member 68 vibrate synchronously. Consequently, the ultrasonic vibration is efficiently transmitted to the chip 4, and the chip 4 can be reliably bonded to the substrate 2.

While flip-chip bonding of the chip with bumps onto the substrate has been described in the above embodiments, the present invention is also applicable to so-called TAB bonding of a chip having a plurality of leads onto a tape and to bonding of metal and metal. That is, the present invention can be applied to all the devices that bond metal and metal by ultrasonic bonding.

While the contact member is attached to the bottom vertex of the ultrasonic horn 10 in the first and second embodiments, a support face to contact with one side face in the direction of ultrasonic vibration and the upper face of a material to be bonded may be directly provided at the bottom vertex.

While the vibration application means (vibrator) is attached to one of the right and left vertexes of the ultrasonic horn 10 in the first and second embodiments, a vibrator may be attached to each of the right and left vertexes. In this case, a high output can be obtained from the bottom vertex serving as the output section. However, it is important that the frequencies of the vibrators should be equal and that the phases thereof should be reverse to each other.

While the turning shaft 36 of the clamping member 35 is supported by the bearing portions 32*a* of the pressing jig 32 separate from the ultrasonic horn 10 in the first embodiment, it may be supported by the node of the ultrasonic horn 10. However, it is preferable that the turning shaft 36 be supported by the bearing portions 32, because vibration leakage is reduced.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An ultrasonic bonding method for bonding a material to a bonding surface by the application of ultrasonic vibration, comprising the steps of:
    clamping two side faces of the material by a clamping motion in the direction of ultrasonic vibration respectively with an application member that applies a predetermined ultrasonic vibration, and a clamping member that performs said clamping motion and is synchronously vibrated in the same direction as that of the application member and at an amplitude substantially equal to that of the application member by the predetermined ultrasonic vibration transmitted from the application member through the material, and
    pressing the material against the bonding surface so as to bond the material to the bonding surface.

2. An ultrasonic bonding method for bonding a material to a bonding surface by the application of ultrasonic vibration, comprising the steps of:
    clamping two side faces of the material in the direction of ultrasonic vibration respectively with an application member that applies a predetermined ultrasonic vibration, and a clamping member that is synchronously vibrated in the same direction as that of the application member and at an amplitude substantially equal to that of the application member by the predetermined ultrasonic vibration transmitted from the application member through the material, and
    pressing the material against the bonding surface so as to bond the material to the bonding surface; and,
    wherein the material is bonded to the bonding surface while urging the clamping-member at a node of the clamping member, in such a direction that the clamping member presses the material against the application member.

3. An ultrasonic bonding method according to claim 1, wherein a predetermined pressing load is applied to the application member in a direction so as to press the material against the bonding surface, during the application of the ultrasonic vibration.

4. An ultrasonic bonding method according to claim 1, wherein the opposing distance between the material and the bonding surface is controlled, during the application of the ultrasonic vibration.

5. An ultrasonic bonding method according to claim 1, wherein the resonant frequency of the clamping member is shifted from the frequency of the ultrasonic vibration so that the amplitude of the clamping member is substantially equal to the amplitude of the application member.

6. An ultrasonic bonding device for bonding a material to a bonding surface by the application of ultrasonic vibration, the device comprising:
    a vibrator for producing ultrasonic vibration;
    an application member that supports one side face of the material in the direction of the ultrasonic vibration and that applies the ultrasonic vibration produced by the vibrator to the material;
    a clamping member that supports the other side face of the material and performs a clamping motion in the direction of the ultrasonic vibration and that is synchronously vibrated in the same direction as that of the application member and at an amplitude substantially equal to that of the application member by the ultrasonic vibration transmitted from the application member through the material; and
    an urging member which urges the clamping member in said direction so as to clamp the material in cooperation with the application member,
    wherein the application member, the clamping member, and the material vibrate together in the direction of the ultrasonic vibration.

7. An ultrasonic bonding device for bonding a material to a bonding surface by the application of ultrasonic vibration, the device comprising:
    a vibrator for producing ultrasonic vibration;
    an application member that supports one side face of the material in the direction of the ultrasonic vibration and that applies the ultrasonic vibration produced by the vibrator to the material;
    a clamping member that supports the other side face of the material in the direction of the ultrasonic vibration and that is synchronously vibrated in the same direction as that of the application member and at an amplitude substantially equal to that of the application member by the ultrasonic vibration transmitted from the application member through the material; and
    an urging member which urges the clamping member in a direction so as to clamp the material in cooperation with the application member,
    wherein the application member, the clamping member, and the material vibrate together in the direction of the ultrasonic vibration; and,
    wherein the urging member is connected to a node of the clamping member.

8. An ultrasonic bonding device according to claim 6, wherein the application member has a first face for supporting the one side face of the material in the direction of the ultrasonic vibration, and a second face substantially parallel to the bonding surface to support an upper surface of the material, and the second face has a suction hole for drawing the material.

9. An ultrasonic bonding device for bonding a material to a bonding surface by the application of ultrasonic vibration, the device comprising:
- a vibrator for producing ultrasonic vibration;
- an application member that supports one side face of the material in the direction of the ultrasonic vibration and that applies the ultrasonic vibration produced by the vibrator to the material;
- a clamping member that supports the other side face of the material in the direction of the ultrasonic vibration and that is synchronously vibrated in the same direction as that of the application member and at an amplitude substantially equal to that of the application member by the ultrasonic vibration transmitted from the application member through the material; and
- an urging member which urges the clamping member in a direction so as to clamp the material in cooperation with the application member,
- wherein the application member, the clamping member, and the material vibrate together in the direction of the ultrasonic vibration; and, further comprising:
- a load control member which applies a controlled downward pressing load to the application member.

10. An ultrasonic bonding device for bonding a material to a bonding surface by the application of ultrasonic vibration, the device comprising:
- a vibrator for producing ultrasonic vibration;
- an application member that supports one side face of the material in the direction of the ultrasonic vibration and that applies the ultrasonic vibration produced by the vibrator to the material;
- a clamping member that supports the other side face of the material in the direction of the ultrasonic vibration and that is synchronously vibrated in the same direction as that of the application member and at an amplitude substantially equal to that of the application member by the ultrasonic vibration transmitted from the application member through the material; and
- an urging member which urges the clamping member in a direction so as to clamp the material in cooperation with the application member,
- wherein the application member, the clamping member, and the material vibrate together in the direction of the ultrasonic vibration; and, further comprising:
- a position control member which controls the amount of downward movement of the application member.

11. An ultrasonic bonding device according to any one of claims 7, 9 and 10, wherein the application member is an ultrasonic horn shaped like a substantially symmetric inverted triangle, the vibrator is mounted at at least one of the right and left vertexes of the ultrasonic horn, and an output section is provided at a bottom vertex of the ultrasonic horn to apply ultrasonic vibration to the material, and
- wherein, when an ultrasonic vibration substantially parallel to an oblique side adjoining said at least one of the right and left vertexes of the ultrasonic horn is input from the vibrator, a horizontal ultrasonic vibration is output from the output section.

12. An ultrasonic bonding device for bonding a material to a bonding surface by the application of ultrasonic vibration, the device comprising:
- a vibrator for producing ultrasonic vibration;
- an application member that supports one side face of the material in the direction of the ultrasonic vibration and that applies the ultrasonic vibration produced by the vibrator to the material;
- a clamping member that supports the other side face of the material and performs a clamping motion in the direction of the ultrasonic vibration and that is synchronously vibrated in the same direction as that of the application member and at an amplitude substantially equal to that of the application member by the ultrasonic vibration transmitted from the application member through the material; and
- an urging member which urges the clamping member in said direction so as to clamp the material in cooperation with the application member,
- wherein the application member, the clamping member, and the material vibrate together in the direction of the ultrasonic vibration,
- wherein the application member is an ultrasonic horn shaped like a substantially symmetric inverted triangle, the vibrator is mounted at at least one of the right and left vertexes of the ultrasonic horn, and an output section is provided at a bottom vertex of the ultrasonic horn to apply ultrasonic vibration to the material, and
- wherein, when an ultrasonic vibration substantially parallel to an oblique side adjoining said at least one of the right and left vertexes of the ultrasonic horn is input from the vibrator, a horizontal ultrasonic vibration is output from the output section.

13. An ultrasonic bonding device according to claim 12, wherein the application member has a first face for supporting the one side face of the material in the direction of the ultrasonic vibration, and a second face substantially parallel to the bonding surface to support an upper surface of the material, and the second face has a suction hole for drawing the material.

* * * * *